(12) United States Patent
Kim et al.

(10) Patent No.: US 8,018,052 B2
(45) Date of Patent: Sep. 13, 2011

(54) INTEGRATED CIRCUIT PACKAGE SYSTEM WITH SIDE SUBSTRATE HAVING A TOP LAYER

(75) Inventors: KyungOe Kim, Daegeon (KR); Taewoo Kang, Suwon-si (KR); HyunSu Shin, Incheon (KR)

(73) Assignee: Stats Chippac Ltd., Singapore (SG)

( * ) Notice: Subject to any disclaimer, the term of this patent is extended or adjusted under 35 U.S.C. 154(b) by 323 days.

(21) Appl. No.: 11/772,044

(22) Filed: Jun. 29, 2007

(65) Prior Publication Data

US 2009/0001545 A1    Jan. 1, 2009

(51) Int. Cl.
H01L 23/48    (2006.01)
H01L 21/58    (2006.01)

(52) U.S. Cl. ......... 257/710; 257/E23.01; 257/E21.505; 257/690; 257/704; 257/708; 257/701; 257/700; 257/778; 257/737; 257/738; 257/758; 438/106

(58) Field of Classification Search .............. 257/690, 257/E23.01, E21.505, 704, 710, 708, 701, 257/700, 778, 737, 738, 758
See application file for complete search history.

(56) References Cited

U.S. PATENT DOCUMENTS

| | | | |
|---|---|---|---|
| 4,245,273 A | 1/1981 | Feinberg et al. | |
| 5,029,279 A | 7/1991 | Sasaki et al. | |
| 5,060,116 A | 10/1991 | Grobman et al. | |
| 5,508,938 A | 4/1996 | Wheeler | |
| 5,652,466 A * | 7/1997 | Hirakawa et al. | 257/772 |
| 5,866,943 A * | 2/1999 | Mertol | 257/712 |
| 5,883,428 A * | 3/1999 | Kabumoto et al. | 257/691 |
| 6,573,600 B2 | 6/2003 | Kikuchi et al. | |
| 6,770,537 B2 | 8/2004 | Farrar | |
| 7,009,307 B1 * | 3/2006 | Li | 257/783 |
| 7,396,700 B2 * | 7/2008 | Hsu | 438/107 |
| 7,429,502 B2 * | 9/2008 | Archer et al. | 438/122 |
| 7,635,916 B2 * | 12/2009 | Jensen et al. | 257/704 |
| 7,719,110 B2 * | 5/2010 | Zhao et al. | 257/707 |
| 7,728,440 B2 * | 6/2010 | Honda | 257/778 |
| 2001/0033017 A1 * | 10/2001 | Wang et al. | 257/698 |
| 2003/0030134 A1 * | 2/2003 | Tao | 257/678 |
| 2004/0150118 A1 * | 8/2004 | Honda | 257/778 |
| 2005/0199998 A1 | 9/2005 | Chen et al. | |
| 2006/0043583 A1 * | 3/2006 | Tamagawa et al. | 257/720 |
| 2006/0087020 A1 * | 4/2006 | Hirano et al. | 257/686 |
| 2006/0237225 A1 * | 10/2006 | Kariya et al. | 174/260 |
| 2008/0090335 A1 * | 4/2008 | Morimoto et al. | 438/118 |
| 2009/0009979 A1 * | 1/2009 | Mori et al. | 361/784 |

FOREIGN PATENT DOCUMENTS

JP    2006-41270 A  *  2/2006

* cited by examiner

Primary Examiner — Alexander O Williams

(74) Attorney, Agent, or Firm — Mikio Ishimaru

(57) ABSTRACT

An integrated circuit package system comprising: providing a package substrate; attaching an integrated circuit over the package substrate; and attaching a side substrate adjacent the integrated circuit over the package substrate.

20 Claims, 4 Drawing Sheets

INTEGRATED CIRCUIT PACKAGE SYSTEM WITH SIDE SUBSTRATE HAVING A TOP LAYER

TECHNICAL FIELD

The present invention relates generally to integrated circuit package systems, and more particularly to a system for integrated circuit packages with cavity substrate.

BACKGROUND ART

Packaged integrated circuits are in all portable electronic products, such as cell phones, portable computers, voice recorders, etc. as well as in many larger electronic systems, such as cars, planes, industrial control systems, etc.

Across virtually all applications, there continues to be demand for reducing the size and increasing performance of the devices. The intense demand is no more visible than in portable electronics.

The demands for smaller, higher performance semiconductor devices have motivated the development of new techniques for producing smaller and less expensive semiconductor devices.

One of these technologies involves packaging the integrated circuit chip in as small a form factor as possible and manufacturing the integrated circuit chip as efficiently as possible.

Higher integration and more functions result in large integrated circuit die size. New integrated circuit technology has advanced from Non-low k to 90 nm Low k, and ETC to provide the integration and functionality but introducing problems in package substrates.

Process complexity and cost have become issues with more dense and increased layer substrates such as 2-2-2, 3-2-3, 4-2-4, 5-2-5, etc. The more complex integrated circuits require package substrates with increased manufacturing difficulty and higher costs.

Attempts to meet the package substrate requirements such as "Build-up" methodology result in high cost substrates to accommodate large numbers of power and ground lines as well as signal lines.

These high end packages also often require stiffeners, heat spreaders or hat type spreaders for structural integrity or thermal management. These often-necessary additions can also increase size, complexity, and costs in addition to the substrates.

Virtually all electronic products benefit from increasing features (including functions and performance) in integrated circuit chips all while being designed into ever smaller physical space. These demands are often very visible with the many consumer electronic products including but not limited to personal portable devices, such as cellular phones, digital cameras, and music players.

Despite the advantages of recent developments in semiconductor fabrication and packaging techniques, there is a continuing need for improving performance, functions, manufacturing processes, and costs.

Thus, a need still remains for an integrated circuit package system to provide increased performance, more functions, improved manufacturing processes, and reduced costs. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a package substrate; attaching an integrated circuit over the package substrate; and attaching a side substrate adjacent the integrated circuit over the package substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
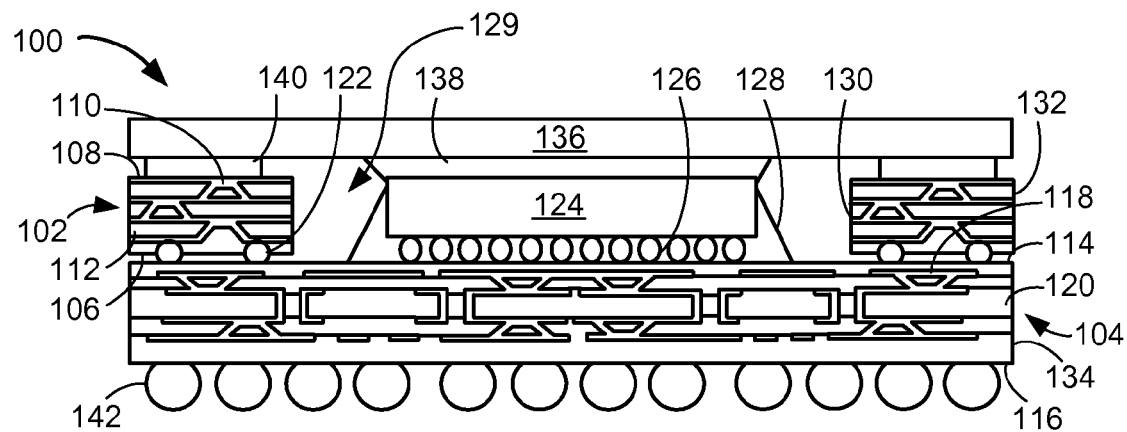
FIG. 1 is a cross-sectional view of an integrated circuit package system taken along line 1--1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
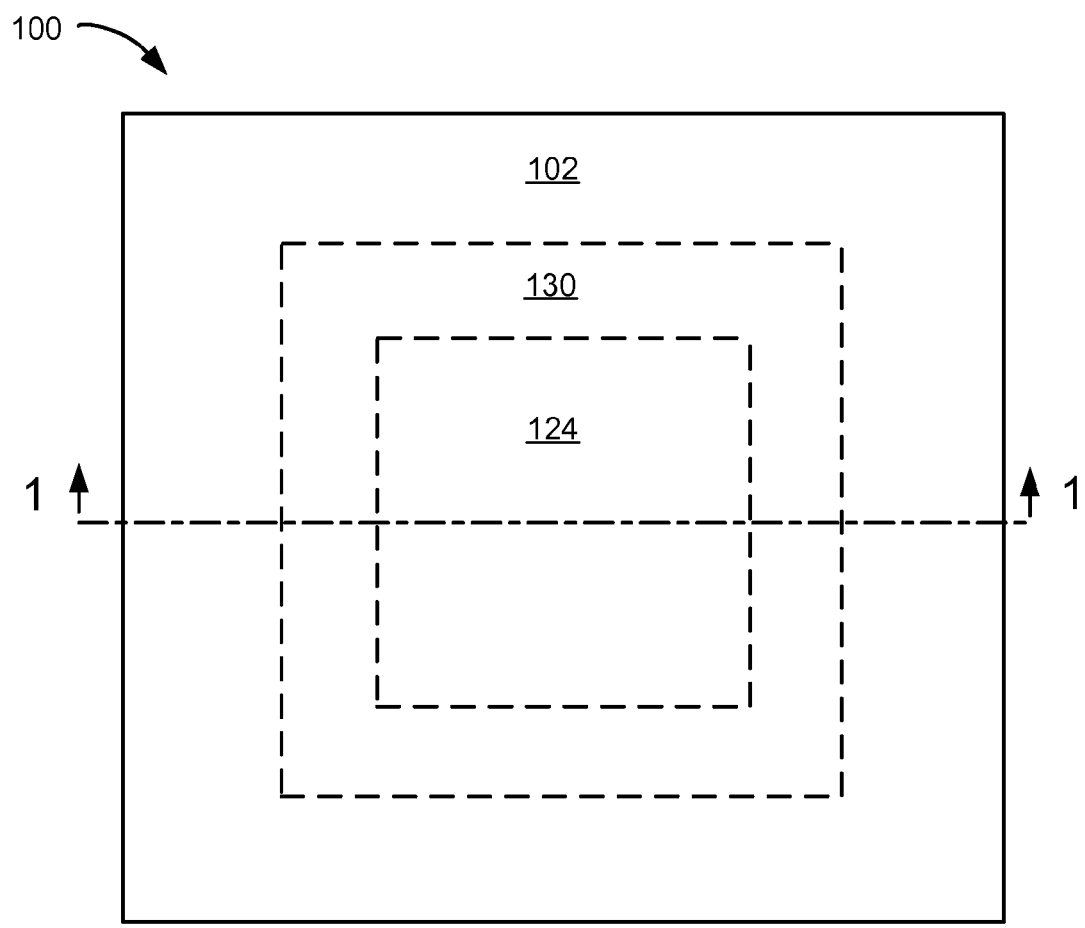
FIG. 2 is a top plan view of the integrated circuit package system.

Referring now to FIG. 1, therein is shown a cross-sectional view of an integrated circuit package system 100 taken along line 1—1 of FIG. 2 in a first embodiment of the present invention. The integrated circuit package system 100 preferably includes a side substrate 102 over a perimeter of a package substrate 104.

The side substrate 102 includes a side substrate first surface 106 such an interconnection surface to the package substrate and a side substrate second surface 108 such as a mounting surface. The side substrate 102 can also include side substrate traces 110 and a side substrate dielectric 112.

Similarly, the package substrate 104 includes a package substrate first surface 114 such as an interconnection surface and a package substrate second surface 116 such as a next level connection surface. The package substrate 104 can also include package substrate traces 118 and a package substrate dielectric 120.

The side substrate 102 can be connected electrically or mechanically to the package substrate 104 with substrate connectors 122 such as solder bumps or solder balls. The substrate connectors 122 can be attached over the side substrate first surface 106 and over the package substrate first surface 114.

The substrate connectors 122 can provide connectivity for distributed signal lines without increasing layers in the package substrate 104. Signals including power and ground can be distributed or re-routed from the package substrate traces 118 through the substrate connectors 122 with the distributed signal lines formed by the side substrate traces 110.

An integrated circuit 124 such as a flip chip can be attached over the package substrate first surface 114. Optionally, die connectors 126 or a fill layer 128 can be applied for electrical or mechanical connectivity of the integrated circuit 124 and the package substrate first surface 114. The fill layer 128 is shown filling between the integrated circuit 124 and the package substrate 104 and is shown leaving an unfilled gap 129 between the integrated circuit 124 and the side substrate 102, unfilled by the fill layer 128.

The integrated circuit 124 is adjacent a side substrate inner edge 130. The side substrate 102 also includes a side substrate outer edge 132 substantially aligned with a package substrate outer edge 134, the side substrate outer edge 132 and the package substrate outer edge 134 forming a substantially vertical plane.

The side substrate second surface 108 on a side opposite the package substrate 104 can preferably provide a mounting surface for a top layer 136 such as a stiffener or heat spreader. The top layer 136 can be applied over the integrated circuit 124 with a die attach layer 138 and the side substrate second surface 108 with a substrate attach layer 140.

Package connectors 142 such as solder bumps or solder balls can preferably be applied over the package substrate second surface 116 on a side opposite the top layer 136. The package connectors 142 can provide electrical or mechanical connectivity to a next level system such as another package or a printed circuit board (PCB).

It has been discovered that the integrated circuit package system 100 with the side substrate 102 provides distributed signals, reduced substrate layers, embedded components, increased functionality, and improved heat spreader connectivity for high-end integrated circuit package such as a low cost Flip Chip Ball Grid Array with heat spreader (fcBGA-H).

Referring now to FIG. 2 therein is shown a top plan view of the integrated circuit package system 100. The integrated circuit package system 100 preferably includes the side substrate 102 shown with hidden lines. The side substrate 102 are adjacent the integrated circuit 124 also shown with hidden lines.

The top layer 136 can provide an exposed surface on a side opposite the package substrate 104 of FIG. 1. The exposed surface can provide thermal conduction or heat spreading to an ambient environment or a next level system. The top layer 136 can optionally provide thermal enhancement for the integrated circuit package system 100.

Figure 3:
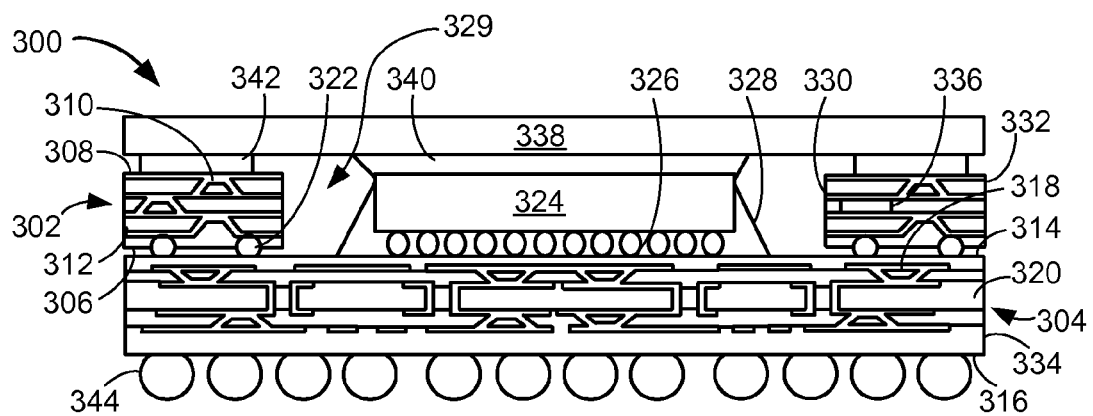
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a side substrate 302 over a perimeter of a package substrate 304.

The side substrate 302 includes a side substrate first surface 306 such an interconnection surface to the package substrate and a side substrate second surface 308 such as a mounting surface. The side substrate 302 can also include side substrate traces 310 and a side substrate dielectric 312.

The package substrate 304 includes a package substrate first surface 314 such as an interconnection surface and a package substrate second surface 316 such as a next level connection surface. The package substrate 304 can also include package substrate traces 318 and a package substrate dielectric 320.

The side substrate 302 can be connected electrically or mechanically to the package substrate 304 with substrate connectors 322 such as solder bumps or solder balls. The substrate connectors 322 can be attached over the side substrate first surface 306 and over the package substrate first surface 314.

The substrate connectors 322 can provide connectivity for distributed signal lines without increasing layers in the package substrate 304. Signals including power and ground can be distributed or re-routed from the package substrate traces 318 through the substrate connectors 322 with the distributed signal lines formed by the side substrate traces 310.

An integrated circuit 324 such as a flip chip can be attached over the package substrate first surface 314. Optionally, die connectors 326 or a fill layer 328 can be applied for electrical or mechanical connectivity of the integrated circuit 324 and the package substrate first surface 314. The fill layer 328 is shown filling between the integrated circuit 324 and the package substrate 304 and is shown leaving an unfilled gap 329 between the integrated circuit 324 and the side substrate 302, unfilled by the fill layer 328.

The integrated circuit 324 is adjacent a side substrate inner edge 330. The side substrate 302 also includes a side substrate outer edge 332 substantially aligned with a package substrate outer edge 334, the side substrate outer edge 332, and the package substrate outer edge 334 forming a substantially vertical plane.

The side substrate can also include a circuit device 336 such as a passive device. The circuit device 336 can provide additional functions without increasing the size of the package substrate 304. The side substrate traces 310 can optionally connect the circuit device 336 to the substrate connectors 322, the package substrate traces 318, or the integrated circuit 324.

The side substrate second surface 308 on a side opposite the package substrate 304 can preferably provide a mounting surface for a top layer 338 such as a stiffener or heat spreader. The top layer 338 can be applied over the integrated circuit 324 with a die attach layer 340 and the side substrate second surface 308 with a substrate attach layer 342.

Package connectors 344 such as solder bumps or solder balls can preferably be applied over the package substrate second surface 316 on a side opposite the top layer 338. The package connectors 344 can provide electrical or mechanical connectivity to a next level system such as another package or a printed circuit board.

Figure 4:
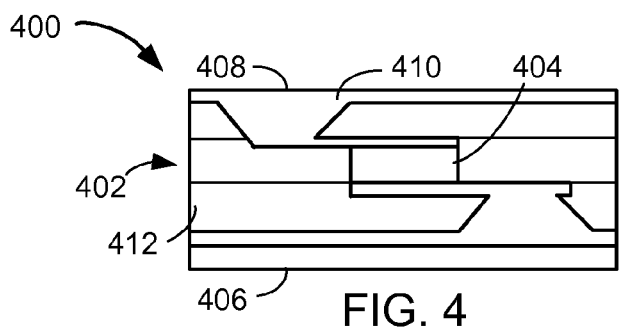
FIG. 4 is a cross-sectional view of an integrated circuit package system in a third embodiment of the present invention.

Referring now to FIG. 4, therein is shown a cross-sectional view of an integrated circuit package system 400 in a substrate forming phase in a third embodiment of the present invention. The integrated circuit package system 400 preferably includes a side substrate 402 and a circuit device 404 such as a capacitor.

The side substrate 402 includes a side substrate first surface 406 such an interconnection surface to the package substrate and a side substrate second surface 408 such as a mounting surface. The side substrate 402 can also include side substrate traces 410 and a side substrate dielectric 412.

The side substrate traces 410 can electrically connect the circuit device 404 to another of the circuit device 404 or a next level system such as another substrate. The side substrate 402 with the circuit device 404 can provide additional functions without increasing the size of other substrates or the integrated circuit package system 400.

Figure 5:
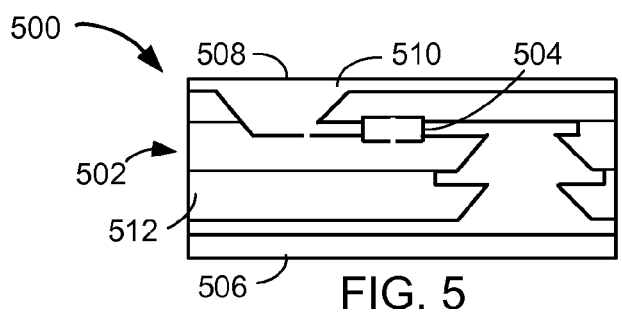
FIG. 5 is a cross-sectional view of an integrated circuit package system in a fourth embodiment of the present invention.

Referring now to FIG. 5, therein is shown a cross-sectional view of an integrated circuit package system 500 in a substrate forming phase in a fourth embodiment of the present invention. The integrated circuit package system 500 preferably includes a side substrate 502 and a circuit device 504 such as a resistor.

The side substrate 502 includes a side substrate first surface 506 such an interconnection surface to the package substrate and a side substrate second surface 508 such as a mounting surface. The side substrate 502 can also include side substrate traces 510 and a side substrate dielectric 512.

The side substrate traces 510 can electrically connect the circuit device 504 to another of the circuit device 504 or a next level system such as another substrate. The side substrate 502 with the circuit device 504 can provide additional functions without increasing the size of other substrates or the integrated circuit package system 500.

Figure 6:
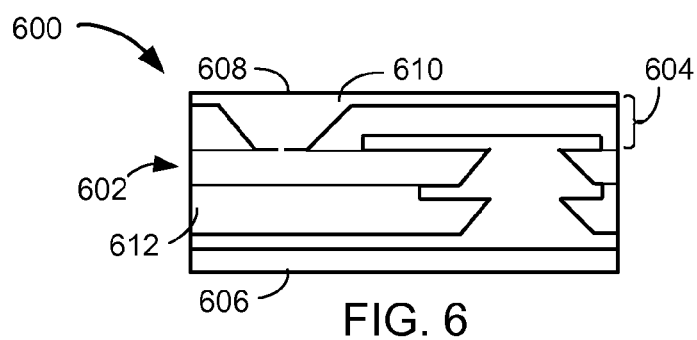
FIG. 6 is a cross-sectional view of an integrated circuit package system in a fifth embodiment of the present invention.

Referring now to FIG. 6, therein is shown a cross-sectional view of an integrated circuit package system 600 500 in a substrate forming phase in a fifth embodiment of the present invention. The integrated circuit package system 600 preferably includes a side substrate 602 and a circuit device 604 such as an inductor.

The side substrate 602 includes a side substrate first surface 606 such an interconnection surface to the package substrate and a side substrate second surface 608 such as a mounting surface. The side substrate 602 can also include side substrate traces 610 and a side substrate dielectric 612.

A spacing between two or more of the side substrate traces 610 can form the circuit device 604 and electrically connect to another of the circuit device 604 or a next level system. The side substrate 602 with the circuit device 604 can provide additional functions without increasing the size of other substrates or the integrated circuit package system 600.

Figure 7:
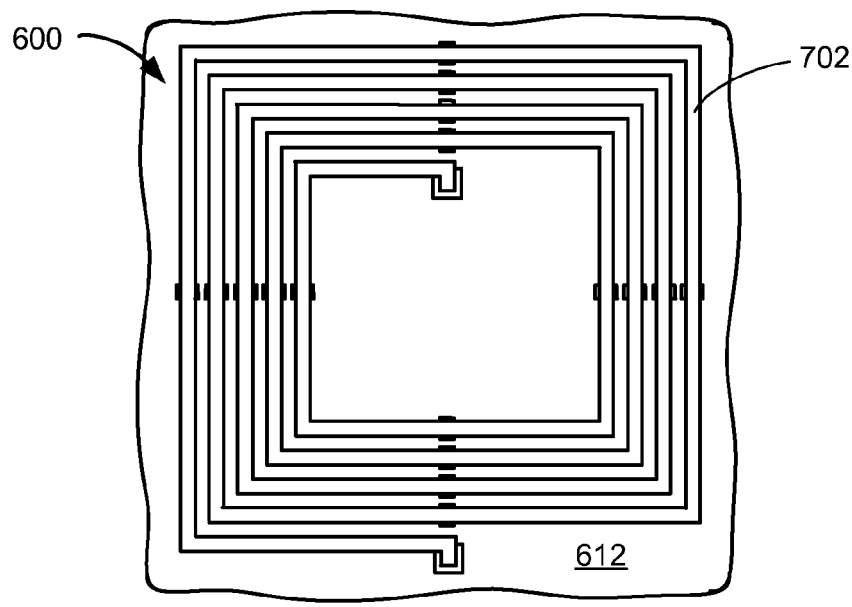
FIG. 7 is an isometric view of an integrated circuit package system in an inductor forming phase.

Referring now to FIG. 7, therein is shown an isometric view of the integrated circuit package system 600 in an inductor forming phase. The integrated circuit package system 600 can optionally include a circuit device 702 such as a spiral inductor.

A spacing between one portion of the circuit device 702 and another adjacent portion of the circuit device 702 can provide an electrical field. The electrical field in the side substrate dielectric 612 modifies a signal in the circuit device 702. The modified signal can provide additional functions without increasing the size of other substrates or the integrated circuit package system 600.

Figure 8:
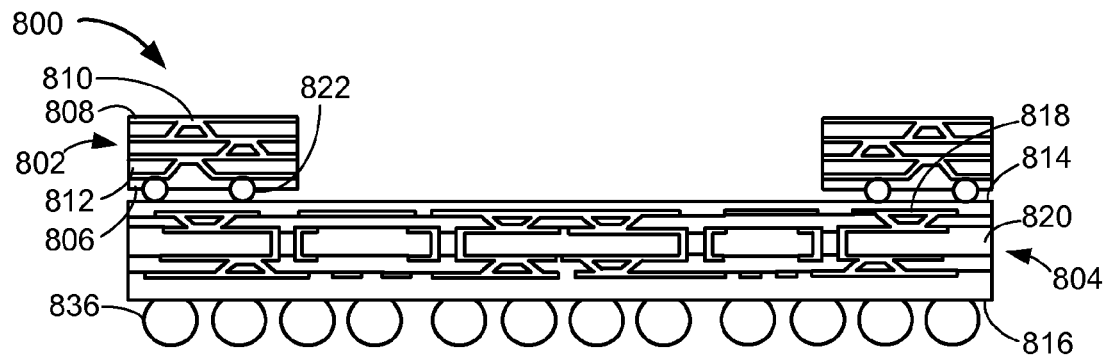
FIG. 8 is a cross-sectional view of an integrated circuit package system taken along the line 8--8 of FIG. 9 in a substrate attaching phase in a sixth embodiment of the present invention.
Figure 9:
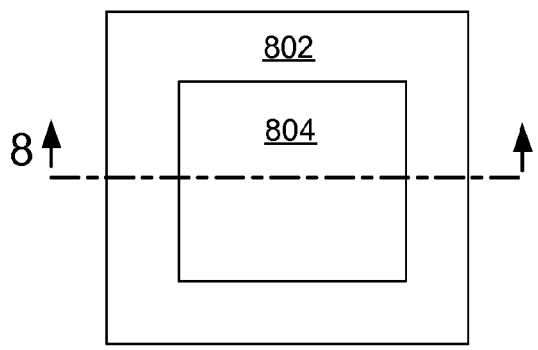
FIG. 9 is a top plan view of an integrated circuit package system 900 in a substrate attaching phase in a seventh embodiment of the present invention.

Referring now to FIG. 8, therein is shown a cross-sectional view of an integrated circuit package system 800 taken along the line 8-8 of FIG. 9 in a substrate attaching phase in a sixth embodiment of the present invention. The integrated circuit package system 800 preferably includes a side substrate 802 over a package substrate 804.

The side substrate 802 includes a side substrate first surface 806 such as an interconnection surface to the package substrate and a side substrate second surface 808 such as a mounting surface. The side substrate 802 can also include side substrate traces 810 and a side substrate dielectric 812.

Similarly, the package substrate 804 includes a package substrate first surface 814 such as an interconnection surface and a package substrate second surface 816 such as a next level connection surface. The package substrate 804 can also include package substrate traces 818 and a package substrate dielectric 820.

The side substrate 802 can be connected electrically or mechanically to the package substrate 804 with substrate connectors 822 such as solder bumps or solder balls. The substrate connectors 822 can be attached over the side substrate first surface 806 and over the package substrate first surface 814.

The substrate connectors 822 can provide connectivity for distributed signal lines without increasing layers in the package substrate 804. Signals including power and ground can be distributed or re-routed from the package substrate traces 818 through the substrate connectors 822 with the distributed signal lines formed by the side substrate traces 810.

Package connectors 836 such as solder bumps or solder balls can preferably be applied over the package substrate second surface 816. The package connectors 836 can provide electrical or mechanical connectivity to a next level system such as another package or a printed circuit board (PCB).

Referring now to FIG. 9, therein is shown a top plan view of an integrated circuit package system 900 in a substrate attaching phase in a seventh embodiment of the present invention. The integrated circuit package system 900 preferably includes the side substrate 802 over the package substrate 804.

The side substrate 802 can be formed as a single substrate providing electrical connectivity around a perimeter of the package substrate 804. The side substrate traces 810 of FIG. 8 can provide distributed signal lines without increasing layers in the package substrate 804.

Figure 10:
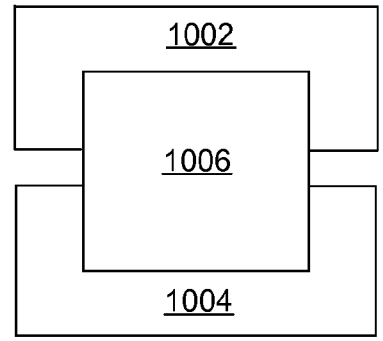
FIG. 10 is a top plan view of an integrated circuit package system 1000 in a substrate attaching phase in an eighth embodiment of the present invention.

Referring now to FIG. 10, therein is shown a top plan view of an integrated circuit package system 1000 in a substrate attaching phase in an eighth embodiment of the present invention. The integrated circuit package system 1000 preferably includes a first side substrate 1002 and a second side substrate 1004 over a package substrate 1006.

The first side substrate 1002 and the second side substrate 1004 can be formed as two substrates providing electrical connectivity around partial perimeters of the package substrate 1006. The first side substrate 1002 and the second side substrate 1004 can provide distributed signal lines without increasing layers in the package substrate 1006.

For illustrative purposes, the integrated circuit package system 1000 is shown having the first side substrate 1002 and the second side substrate 1004 although it is understood that any number of side substrates may be used.

Figure 11:
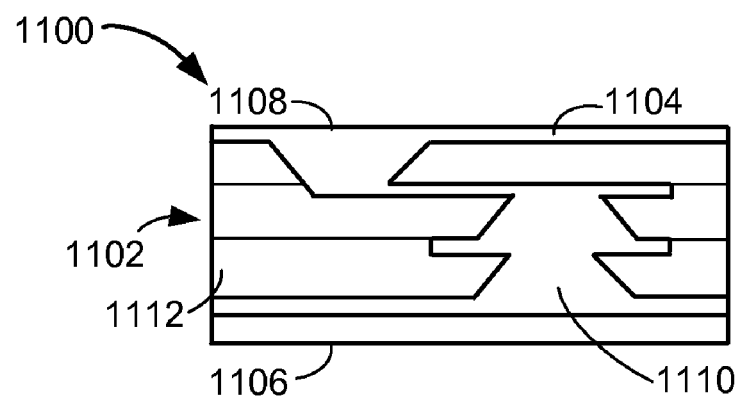
FIG. 11 is a cross-sectional view of an integrated circuit package system in a ninth embodiment of the present invention.

Referring now to FIG. 11, therein is shown a cross-sectional view of an integrated circuit package system 1100 in a ninth embodiment of the present invention. The integrated circuit package system 1100 preferably includes a side substrate 1102 and a conductive layer 1104 such as a copper plane.

The side substrate 1102 includes a side substrate first surface 1106 such as an interconnection surface to the package substrate and a side substrate second surface 1108 such as a mounting surface. The side substrate 1102 can also include side substrate traces 1110 and a side substrate dielectric 1112.

The conductive layer 1104 can be substantially exposed to a next level system on the side substrate second surface 1108. The side substrate 1102 with the conductive layer 1104 can provide additional connectivity or functions without increasing the size or layers of other substrates or the integrated circuit package system 1100.

Figure 12:
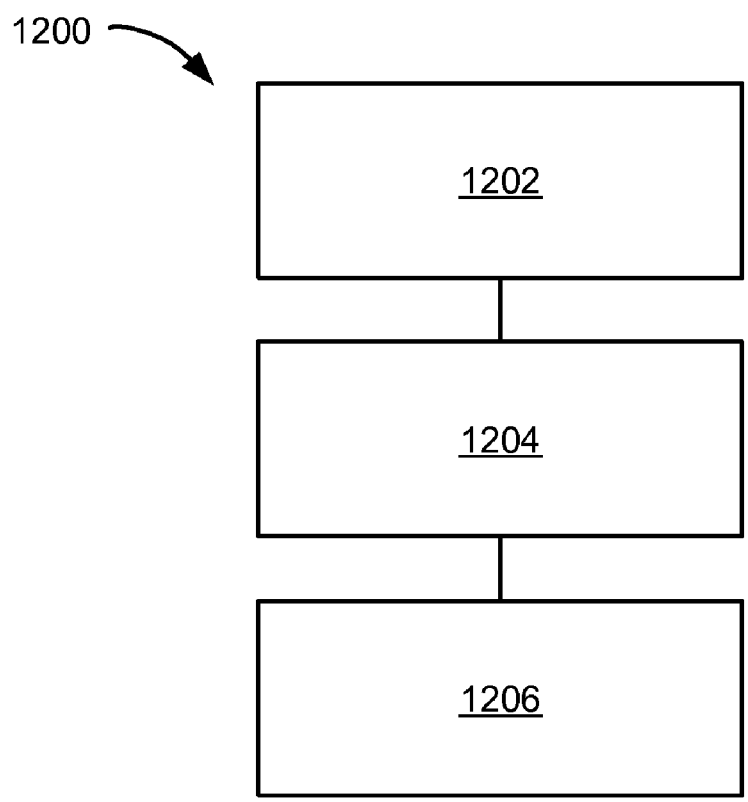
FIG. 12 is a flow chart of an integrated circuit package system for manufacturing the integrated circuit package system in an embodiment of the present invention.

Referring now to FIG. 12, therein is shown a flow chart of an integrated circuit package system 1200 for manufacturing the integrated circuit package system 100 in an embodiment of the present invention. The system 1200 includes providing a package substrate in a block 1202; attaching an integrated circuit over the package substrate in a block 1204; and attaching a side substrate adjacent the integrated circuit over the package substrate in a block 1206.

In greater detail, a system to provide the method and apparatus of the integrated circuit package system 100, in an embodiment of the present invention, is performed as follows:

1. Providing a package substrate having package substrate traces.
2. Attaching a side substrate having side substrate traces over a perimeter of the package substrate.
3. Attaching an integrated circuit adjacent the side substrate over the package substrate, the integrated circuit connected to the package substrate traces and the side substrate traces.
4. Attaching a top layer over the side substrate and the integrated circuit on a side opposite the package substrate.
5. Forming a conductive material partially in the connection cavity over the leads.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a package substrate;
   attaching an integrated circuit over the package substrate;
   applying a fill layer between the integrated circuit and the package substrate;
   attaching a side substrate having side substrate traces and a substrate connector, adjacent the integrated circuit and over the package substrate with the substrate connector on the package substrate, and leaving an unfilled gap between the integrated circuit and the side substrate, unfilled by the fill layer;
   aligning a side substrate outer edge with a package substrate outer edge; and
   attaching a heat spreader to the side substrate with a substrate attach layer.

2. The method as claimed in claim 1 wherein aligning the side substrate outer edge with the package substrate outer edge includes aligning along a vertical plane.

3. The method as claimed in claim 1 wherein attaching the side substrate includes attaching the side substrate having a circuit device.

4. The method as claimed in claim 1 wherein attaching the side substrate includes attaching the side substrate having side substrate traces.

5. The method as claimed in claim 1 wherein attaching the side substrate includes attaching the side substrate having a conductive layer substantially exposed.

6. A method for manufacturing an integrated circuit package system comprising:
   providing a package substrate having package substrate traces;
   attaching an integrated circuit over the package substrate;
   applying a fill layer between the integrated circuit and the package substrate;
   attaching a side substrate having side substrate traces and a substrate connector over a perimeter of the package substrate and adjacent to the integrated circuit with the integrated circuit connected to the package substrate traces and the side substrate traces, and leaving an unfilled gap between the integrated circuit and the side substrate, unfilled by the fill layer;
   aligning a side substrate outer edge with a package substrate outer edge; and
   attaching a heat spreader over the side substrate and the integrated circuit on a side opposite the package substrate with a substrate attach layer.

7. The method as claimed in claim 6 wherein aligning the side substrate outer edge with the package substrate outer edge includes aligning along a vertical plane.

8. The method as claimed in claim 6 wherein attaching the side substrate includes attaching the side substrate having a circuit device connected to the side substrate traces.

9. The method as claimed in claim 6 wherein attaching the side substrate includes attaching the side substrate having side substrate traces for distributed signal lines.

10. The method as claimed in claim 6 wherein attaching the side substrate includes attaching the side substrate having a conductive layer substantially exposed on a side substrate second surface opposite the package substrate.

11. An integrated circuit package system comprising:
a package substrate;
an integrated circuit over the package substrate;
a fill layer is between the integrated circuit and the package substrate and leaves an unfilled gap between the integrated circuit and the side substrate;
a side substrate having side substrate traces and a substrate connector, adjacent the integrated circuit and over the package substrate with the substrate connector on the package substrate and the side substrate having side substrate traces over a perimeter of the package substrate;
a side substrate outer edge aligned with a package substrate outer edge; and
a heat spreader attached to the side substrate with a substrate attach layer.

12. The system as claimed in claim 11 wherein the side substrate outer edge and the package substrate outer edge align along a vertical plane.

13. The system as claimed in claim 11 wherein the side substrate includes the side substrate having a circuit device.

14. The system as claimed in claim 11 wherein the side substrate includes the side substrate having side substrate traces.

15. The system as claimed in claim 11 wherein the side substrate includes the side substrate having a conductive layer substantially exposed.

16. The system as claimed in claim 11 wherein:
the package substrate has package substrate traces;
the integrated circuit is adjacent the side substrate over the package substrate, the integrated circuit connected to the package substrate traces and the side substrate traces; and
the heat spreader over the side substrate and the integrated circuit on a side opposite the package substrate.

17. The system as claimed in claim 16 wherein the side substrate outer edge and the package substrate outer edge align along a vertical plane.

18. The system as claimed in claim 16 wherein the side substrate includes the side substrate having a circuit device connected to the side substrate traces.

19. The system as claimed in claim 16 wherein the side substrate includes the side substrate having side substrate traces for distributed signal lines.

20. The system as claimed in claim 16 wherein the side substrate includes the side substrate having a conductive layer substantially exposed on a side substrate second surface opposite the package substrate.

* * * * *